United States Patent [19]

Arai

[11] Patent Number: 5,273,460
[45] Date of Patent: Dec. 28, 1993

[54] ELECTRICAL PARTS FOR SURFACE MOUNTING

[75] Inventor: Toshihiro Arai, Maebashi, Japan

[73] Assignee: Hosiden Corporation, Osaka, Japan

[21] Appl. No.: 937,293

[22] Filed: Aug. 31, 1992

[30] Foreign Application Priority Data

Sep. 17, 1991 [JP] Japan .................. 3-74407[U]
Oct. 25, 1991 [JP] Japan .................. 3-87768[U]
Apr. 22, 1992 [JP] Japan .................. 4-26139[U]

[51] Int. Cl.$^5$ ........................... H01R 13/648
[52] U.S. Cl. ........................... 439/609; 439/79
[58] Field of Search .............. 439/78, 79, 83, 567, 439/607, 610, 731, 752, 68, 71, 72, 686, 701, 695, 696, 609

[56] References Cited

U.S. PATENT DOCUMENTS

| | | | |
|---|---|---|---|
| 4,405,189 | 9/1983 | Douty et al. | 439/62 |
| 4,533,203 | 8/1985 | Feldman et al. | 439/65 |
| 4,992,056 | 2/1991 | Douty et al. | 439/83 |
| 5,104,326 | 4/1992 | Smith et al. | 439/79 |
| 5,106,311 | 4/1992 | Yodogawa et al. | 439/329 |

FOREIGN PATENT DOCUMENTS

| | | |
|---|---|---|
| 0165490 | 12/1985 | European Pat. Off. . |
| 0280449 | 8/1988 | European Pat. Off. . |
| 2202682 | 9/1988 | United Kingdom . |

*Primary Examiner*—David L. Pirlot
*Attorney, Agent, or Firm*—Pollock, VandeSande and Priddy

[57] ABSTRACT

An electrical part adapted to be surface mounted on a printed circuit board has a plurality of strip-like terminals that project out in parallel from an insulating body of the electrical part with surfaces of the terminals being held perpendicular to the bottom of the insulating body. The lower marginal edge of each terminal forms a straight connection edge, which lies in a plane parallel to the bottom of the insulating body and is soldered to the corresponding conductor land on a printed circuit board.

11 Claims, 6 Drawing Sheets

ELECTRICAL PARTS FOR SURFACE MOUNTING

BACKGROUND OF THE INVENTION

The present invention relates to electrical parts, or components for surface mounting, such as a connector and a switch, which are adapted to be mounted on a printed circuit board.

Recently it has come into wide use to mount electrical parts or components, such as a connector and a switch, and electronic parts or devices such as various integrated circuits on a printed circuit board having conductor lands. In general, such electrical or electronic parts are called "surface mount parts" or "surface mounting parts". In surface mounting of electrical parts, terminals of required electrical or electronic parts are soldered to corresponding conductor lands formed on a printed circuit board by preparing a printed circuit board having predetermined wiring patterns and conductor lands formed by copper layers, printing soldering paste on the conductor lands to which terminals of the electrical or electronic parts are bonded, positioning the terminals of the parts on the soldering paste on the conductor lands in alignment therewith, and thereafter heating the printed circuit board to reflow (melt) the soldering paste. In this way, the simultaneous soldering of terminals of electrical or electronic parts to corresponding conductor lands on a printed circuit board is attained.

Figure 1:
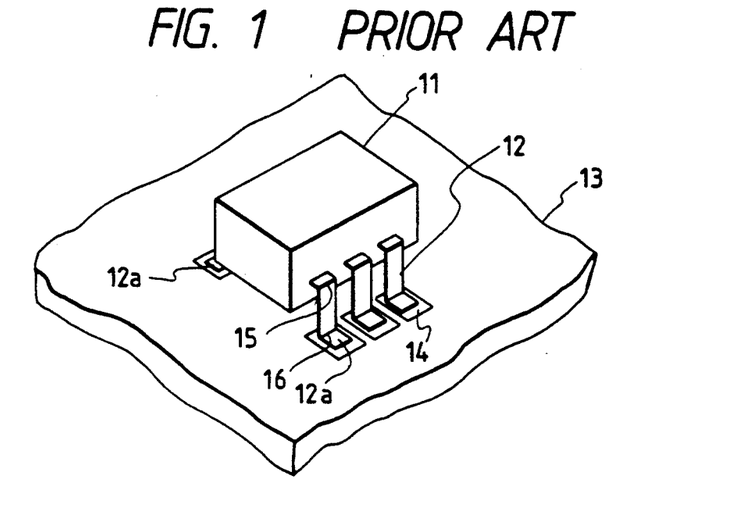
FIG. 1 is a perspective view showing the surface mounting of a conventional electrical part.

Conventional surface-mounting electrical parts of this kind have such a construction as shown in FIG. 1, which is disclosed in U.S. Pat. No. 4,991,059. A rectangular parallelepipedic body 11 has strip-like terminals 12 projecting out of its both sides. The terminals 12 have base portions formed in parallel to the bottom of the body 11 by being bent toward the bottom side of the body 11 and then bent outwardly to form connection portions 12a. These connection portions 12a are soldered to conductor lands 14 formed on a printed circuit board 13.

In conventional surface mounting, the terminals 12 in the case of FIG. 1 are bent in the vicinities of their base portions just projecting out of the body 11 and in the vicinities of their connection portions 12a in directions perpendicular to and parallel to the bottom of the body 11, respectively, as indicated by 15 and 16 so that the connection portions 12a are held in contact with the conductor lands 14 in parallel to the bottom of the body 11. However, since the bending accuracy is low, the parallelism between the connection portions 12a and the bottom of the body 11 and their heights are not accurate, and further, their reproducibility is low. On this account, it sometimes occurs that the connection portions 12a incline with respect to or do not make close contact with the surfaces of the conductor lands 14. Hence, the electrical parts are not stable in posture and in position. Therefore, soldering of the connection portions 12a to the conductor lands 14 is bad and the soldering strength is also low. Moreover, the accuracy of the sites for the attachment of the terminals is low and their reproducibility is also low. In addition, since the bottom surface of each connection portion 12a is connected to the conductor land 14, a wide area is required for soldering and there is a limit to the reduction of terminal spacing.

SUMMARY OF THE INVENTION

A first object of the present invention is to provide an electrical part for surface mounting having a plurality of terminals in which end portions of the terminals can abut on corresponding conductor lands on a printed circuit board in parallel with each other with excellent reproducibility and a spacing or gap therebetween can be reduced.

A second object of the present invention is to provide an electrical part which can not only attain said first object but also can be soldered firmly to a printed circuit board by a small number of steps.

According to a first aspect of the present invention, in an electrical part having a plurality of strip-like terminals projecting out of its body, the projecting portions of each terminal is plate-like and its flat face is perpendicular to the bottom of the body. The lower end edge of each projecting portion, near the bottom of the body, forms a straight connection edge in parallel thereto, and each terminal has no portion parallel to the bottom of the body. That is, faces of any portions of the terminal are perpendicular to the bottom of the body.

According to a second aspect of the present invention, a shield case is provided around the above-mentioned electrical part and legs for attachment to the printed circuit board are formed integrally with the shield case at lower marginal edges of its side walls. The legs are each provided in the form of a cylindrical member which extends downward of the bottom of the electrical part and has an axis perpendicular to the plane containing the bottom of the electrical part, preferably, in the form of cylindrical truncated cone which slightly tapers down.

According to a third aspect of the present invention, a shield case is provided around the electrical part according to the first aspect and the shield case has formed integrally therewith legs for attachment to the printed circuit board, which legs extend downwards from lower marginal edges of side walls of the shield case and are semi-cylindrical in section. Moreover, an elastic metal cover is provided to cover the electrical part except at least its bottom, and pressing portions, which face the attachment legs of the shield cover and have their intermediate portions bent away from the legs, are extended from the lower end edges of the cover. The pressing portions are inserted into through holes of the printed circuit board together with the legs.

DESCRIPTION OF THE PREFERRED EMBODIMENTS

Figure 2:
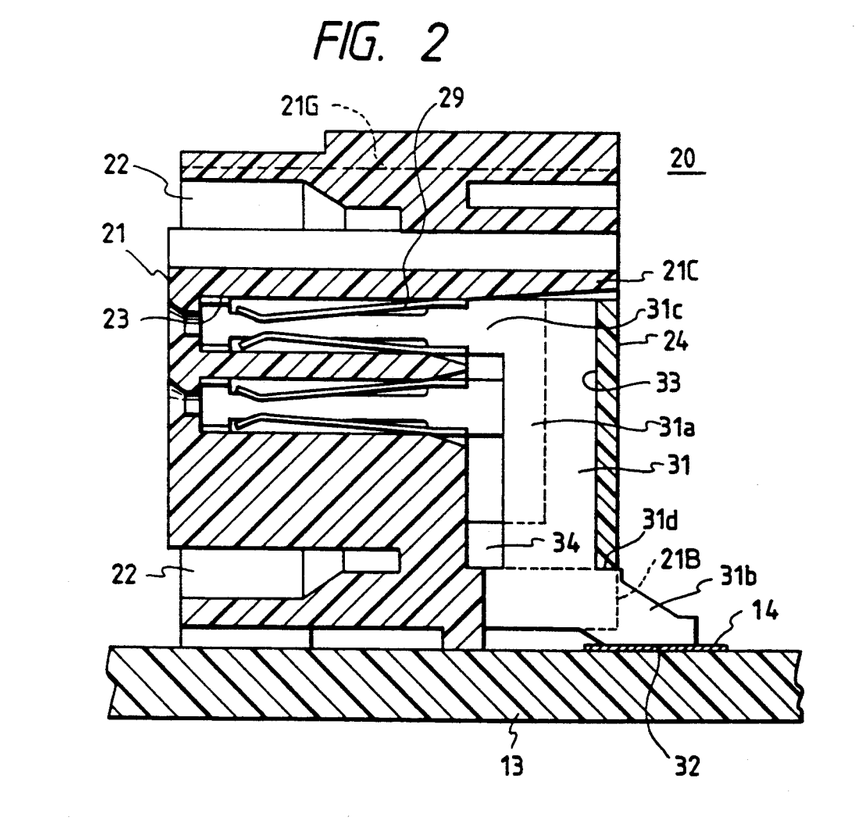
FIG. 2 is a sectional view illustrating an embodiment of the present invention applied to a connector.
Figure 3:
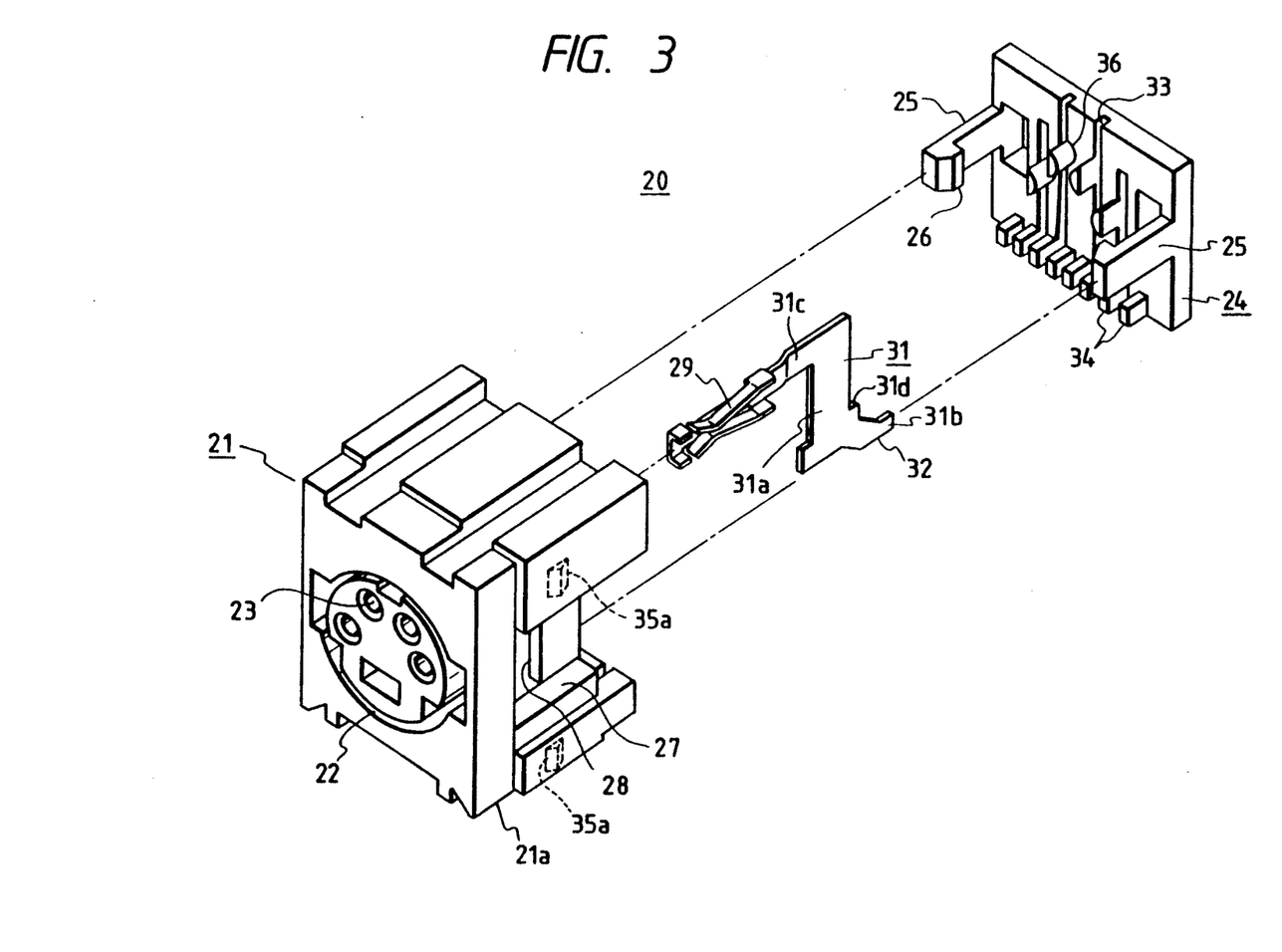
FIG. 3 is an exploded perspective view of the FIG. 2 embodiment.

FIG. 2 illustrates an embodiment according to a first aspect of the present invention and FIG. 3 its exploded perspective view. This example shows an application of the invention to a connector 20. An insulating body 21 of the connector 20 made of a synthetic resin material is substantially rectangular parallelepipedic in shape and has an annular groove 22 formed on the front surface thereof and a plurality of contact receiving holes 23 piercing the body 21 from the front surface toward the rear surface thereof inside the annular groove 22.

The rear of the insulating body 21 is formed as an independent terminal holding portion 24. The terminal holding portion 24 is made of synthetic resin substantially in a plate-like form and has at both sides forwardly extending coupling arms 25 formed integrally therewith, the coupling arms 25 having claws 26 formed integrally therewith at their tip end portions at the insides thereof in opposed relation to each other. In both sides of the insulating body 21 there are provided guide grooves 27 extending forwardly from the rear of the body 21, and each guide groove 27 has a mating recess 28 at its forward end. The guide grooves 27 each receive one of the coupling arms 25 inserted thereinto and the claw 26 engages the recess 28, whereby the terminal holding portion 24 is fitted between a floor portion 21B and a roof portion 21C extending rearwardly of the insulating body 21.

Each contact receiving hole 23 has a contact 29 inserted thereinto from the rear end thereof. The contact 29 is a socket contact which is a generally channel-like member having a substantially U-shaped cross-section so that a pair of opposed side plates thereof can elastically grip therebetween a pin contact of the mating connector.

Each contact 29 has its rear end coupled integrally with the upper front edge of the corresponding terminal 31 through a coupling portion 31c. The terminal 31 has a vertical portion 31a extended from the rear end of the coupling portion 31c toward the bottom 21a of the insulating body 21 (downward in FIGS. 2 and 3) and a leg portion 31b extended rearwardly aslant from the lower end of the vertical portion 31a. The surfaces of the vertical portion 31a and the leg portion 31b are held perpendicular to the bottom 21a of the insulating body 21, and in this embodiment these surfaces lie in the same plane. Each leg portion 31b has a straight lower edge 32 extending in parallel to the bottom 21a of the insulating body 21.

In the state in which the contact receiving holes 23 have received therein the corresponding contacts 29, respectively, the straight lower edges 32 of the leg portions 31b of the terminals 31 are positioned in the same plane parallel to the bottom 21a of the insulating body 21 and disposed in the vicinity of the bottom 21a thereby forming edges for connection to the conductor lands 14 on the printed circuit board 13. The coupling portion 31c and the terminal 31 are formed as a unitary structure by press work of sheet metal.

Formed in the front surface of the terminal holding portion 24 are parallel positioning grooves 33 extending perpendicularly to the bottom 21a of the insulating body 21 for receiving the rear marginal portions of the vertical portions 31a of the terminals 31 so that the terminals 31 are held in position in the lateral direction at right angles to the plane thereof. Thus, the surfaces of the terminals 31 are held in parallel to one another. The rear end portion of the vertical portion 31a of each terminal 31 has a rearwardly projecting stepped portion 31d, against which the lower end face of the terminal holding portion 24 abuts to position the terminal 31 in the direction vertical to the insulating body 21. The leg portion 31b protrudes rearwardly of the back of the terminal holding portion 24. Furthermore, pairs of protrusions 34, each pair for gripping therebetween the lower rear margin of the vertical portion 31a of a corresponding one of the terminals 31, are protrusively provided on the front of the terminal holding portion 24 along its lower marginal portion, and the front end faces of the protrusions 34 abut against the back of the insulating body 21. The terminal holding portion 24 also has stoppers 36 extending forwardly from its front in opposing relation to the respective contact receiving holes 23, and the tips of the stoppers 36 abut against the rear ends of the contacts 29 to limit their rearward movement. In this way, the terminals 31 are accurately positioned in the insulating body 21. The lower edge 32 of the leg portion 31b of each terminal 31, that is, the connection edge 32, can be held accurately at a predetermined height and in parallel to the bottom 21a of the insulating body 21.

As described above, according to the first aspect of the present invention, each terminal 31 of the electrical part has vertical leg portions the faces of which are held perpendicular to the bottom 21a of the insulating body 21, that is, the terminal 31 has no portions the faces of which extend parallel to the bottom 21a of the insulating body 21 (edges of each portion are deemed to have substantially no face). Since punching can be performed with more ease and at a higher degree of accuracy then bending, the connection edges 32 of the leg portions 31b are always retained at a correct position and in a correct shape or configuration with respect to the body 21 so that they are held accurately in parallel to the bottom 21a. Hence, when the insulating body 21 is mounted on the printed circuit board 13, it remains stable thereon and the connection edge 32 contacts the conductor land 14 in parallel thereto whereby they can be soldered thereto stably and firmly. Since the terminal 31 is connected to the conductor land 14 by the thickness of the edge 32 alone, a flow area of solder connecting each terminal 31 to the conductor land 14 is narrow so that the spacing or gaps between the terminals and also, the spacing of conductor lands can be reduced.

In an ordinary electrical part such as a connector or switch, its insulating body is often covered with an electromagnetic shielding metal case. When a connector having such a shield case is surface-mounted onto a printed circuit board, a large external force is applied to the connector when it is engaged with or disengaged from the mating connector. Therefore, when the connector is soldered thin to the wiring pattern over a relatively small area as in ordinary surface mounting, the bonding strength of the solder is insufficient and the connector will readily come off the printed circuit board. Conventionally, such an electrical part to which a relatively large external force is applied, is fixedly secured to the printed circuit board in such a manner as follows: Tongue-shaped attachment legs are each extended from the lower marginal edge of one of both side walls of the shield case, inserted through a circular through hole made in the printed circuit board and then soldered, for example, by dipping, to a conductor land on the back of printed circuit board in a step separate of the soldering step for surface mounting. This method poses a problem as it increases the number of steps involved in the surface mounting process.

A description will be given, with reference to FIGS. 4, 5A, 5B and 5C, of an embodiment according to the second aspect of the invention wherein a shield case is provided on the connector of the embodiment according to the first aspect of the invention described above so as to solve the problem. Since the connector of this embodiment is basically identical in construction with the above-described embodiment except the shield case, reference is also made to FIGS. 2 and 3.

Figure 4:
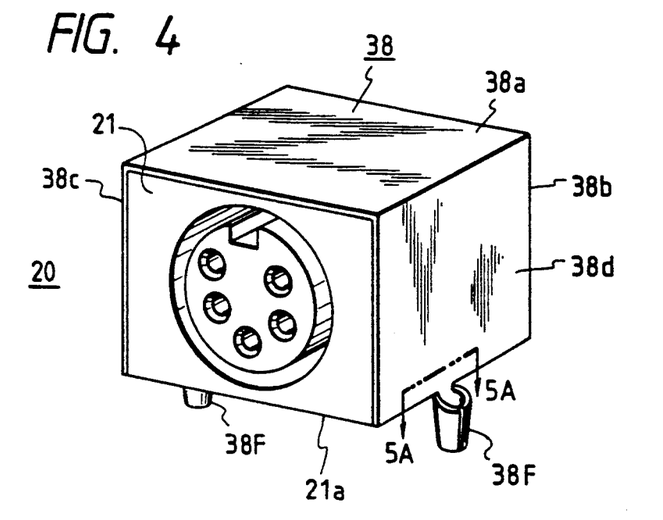
FIG. 4 is a perspective view illustrating another embodiment of the present invention in which the connector in FIG. 2 is covered with a shield case.

This embodiment is identical with the above-described embodiment in that the insulating body 21 is disposed on the printed circuit board 13 with the bottom 21a of the former downward and that the lower marginal edge (the connection edge) 32 of each terminal 31 is soldered to the conductor land 14 on the printed circuit board 13. In this embodiment, the insulating body 21 is covered with a rectangular parallelepipedic shield case 38 which has a top panel 38a, a rear panel 38b and side panels 38c and 38d covering the top and both sides of the insulating body 21 and the back of the terminal holding portion 24, respectively, as depicted in FIG. 4. Attachment legs 38F, formed integrally with the shield case 38 and extending down from lower marginal edges of its side panels 38c and 38d beyond the bottom 21a of the insulating body 21, are each inserted into corresponding through holes 41 in the printed circuit board 13 as shown in FIG. 5B. By soldering each leg 38F to a conductive layer on the inner peripheral surface of the through hole 41 simultaneously with the soldering of the connection edges 32 of the terminals 31 to the conductor land 14 as mentioned previously in conjunction with FIG. 2, it is possible to firmly fix the connector 20, i.e. the electrical part, to the printed circuit board 13 and hence reinforce the soldering of the edges 32 to the conductor lands 14.

Figure 5A:
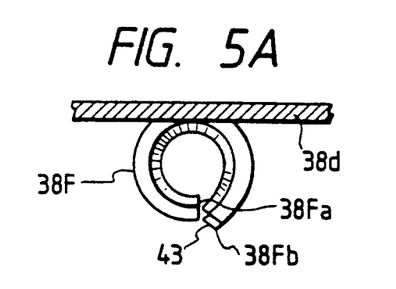
FIG. 5A is a sectional view taken on the line 5A—5A in FIG. 4.
Figure 5B:
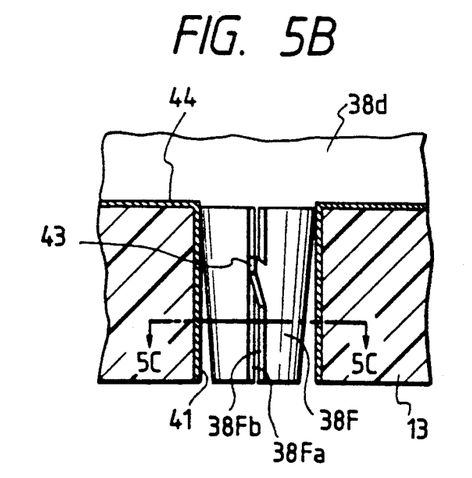
FIG. 5B is a front view showing an attachment leg and its vicinity in FIG. 4.

As shown in FIGS. 4 and 5A, the attachment legs 38F, in particular, one of them is formed as a cylindrical member which has an axis substantially perpendicular to the plane containing the bottom 21a of the insulating body 21 (i.e. the bottom of the electrical part), that is, an axis substantially parallel to the direction in which the leg 38F extends. In this examples, the shield case 38 is formed by press work of sheet metal and square portions, formed integrally with lower marginal edges of the side panels 38c of the shield case 38, are each rolled or bent into a cylindrical form with both side marginal edges 38Fa and 38Fb of the square portions opposed close to or partly overlapping each other. Thus, the legs 38F are formed.

It is preferable that the cylindrical member forming each leg 38F be in the form of an inverted truncated cone which gradually tapers down. In this example, as shown in FIG. 5B, one marginal edge 38Fb forming the cylindrical leg 38F has a press-fit claw 43 which is formed integrally with the marginal edge 38Fb at its intermediate portion in the vertical direction. The press-fit claw 43 is formed as a triangular claw which protrudes outwardly of the cylindrical form of the leg 38F and the protrusion decreases downward. The press-fit claw gets caught in the through hole 41 of the printed circuit board 13 when the leg 38F is pulled up.

Figure 5C:
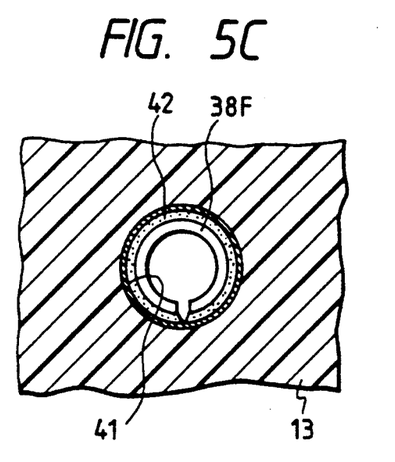
FIG. 5C is a plan view showing the state in which the attachment leg is inserted in a through hole of a printed circuit board and soldered thereto.

When other electrical or electronic parts are mounted on the printed circuit board 13, the electrical part (i.e. the connector) 20 is also mounted on the board 13, with the legs 38F each inserted in a through hole 41 of the board 13. A conductive layer 44 is deposited all over the inner peripheral surface of the through hole 41 and an area around its open end. It is preferably that the leg 38F be pressed into the through hole 41 or that the outer peripheral surface of the leg 38F be as close to the inner peripheral surface of the through hole 41 as possible. Thereafter, the whole printed circuit board 13 is heated to melt the soldering paste. In this instance, the soldering paste coated on the conductive layer surrounding the through hole 41 is molten and flows into the gap between the inner peripheral surface of the through hole 41 and the outer peripheral surface of the leg 38F, by which the peripheral surfaces are bonded together by solder 42 as depicted in FIG. 5C. Thus, the leg 38F is firmly fixed to the through hole 41.

As described above, according to the second aspect of the present invention, since the legs for the attachment of the shield case covering the insulating body to the printed circuit board are cylindrical, the soldering paste molten during the surface mounting of the electrical part onto the printed circuit board, together with other parts, flows into the gap between the through hole and the leg inserted therein, by which the cylindrical leg is soldered over the entire area of its outer peripheral surface to the inner wall of peripheral surface of the through hole, and consequently, they are soldered over a wide area, and hence are firmly bonded together. This avoids the necessity of including the leg soldering step in the surface-mounting process, and hence permits simplification of the process.

In the case where the legs 38F each have the press-fit claw 43 as in a above embodiment, once the leg 38F is pressed into a through hole 41, even if a force is applied to the electrical part in a direction in which the leg 38F comes out therefrom, the claw 43 engages the through hole 41, preventing the leg 38F from coming off. Furthermore, since the cylindrical legs 38F of the shield case 38 are pressed into the through holes 41 of the printed circuit board 13 prior to the soldering thereto of the terminals 31 of the connectors 20, the body 21 can be provisionally fixed to the printed circuit board 13—this facilitates the soldering work. By the provisional fixing of the body 21 to the printed circuit board 13, it is possible to perform, with ease, the positioning of the connection edges 32 of the terminals 31 relative to the conductor lands 14. In addition, the use of the legs 38F further ensures firm fixing of the insulating body 21 to the printed circuit board 13.

Although the present invention has been described above as being applied to a connector, the invention is also applicable to electrical parts to which a relatively strong external force is applied. The above embodiment employs a shield case to firmly fix the body of the electrical part to the printed circuit board to withstand the external force, but this invention is also applicable to any mounting component or member which is made of some other metallic material and is configured to mount the body of an electrical part onto a printed circuit board, and accordingly, to mounting legs thereof.

Figure 6:
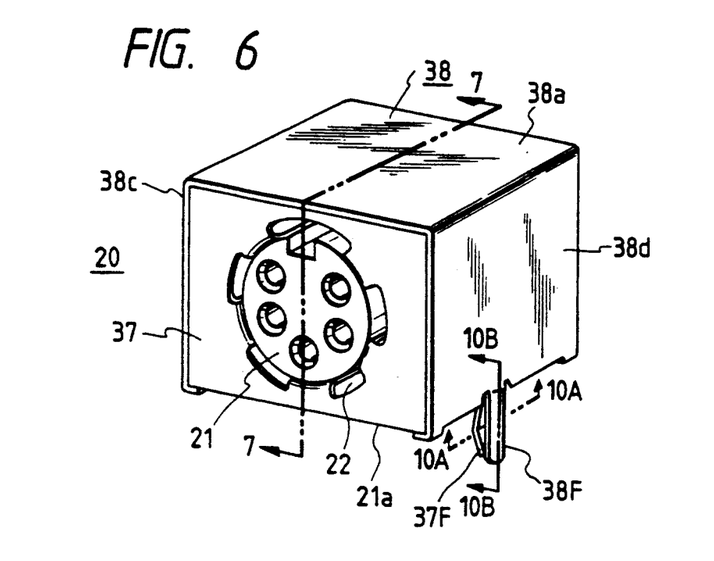
FIG. 6 is a perspective view illustrating another embodiment of the present invention applied to a connector.
Figure 7:
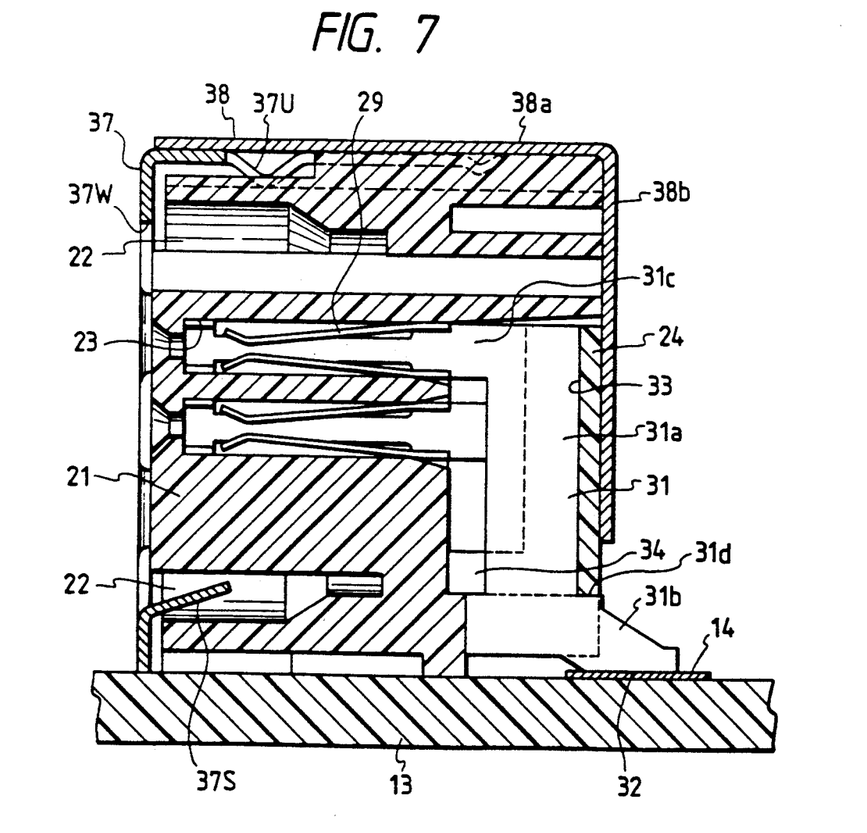
FIG. 7 is a sectional view taken on the line 7—7 in FIG. 6.

In FIG. 6 another embodiment of the surface-mounting electrical part employing the shield case is shown as being applied to a connector as in the case of FIG. 2. FIG. 7 is a sectional view taken on the line 7—7 in FIG. 6. Parts corresponding to those in FIGS. 2 and 4 are identified by the same reference numerals. The insulating body 21, the terminal holding portion 24, the contacts 29 and the strip-like terminals 31 are essentially identical in construction with those of the aforementioned embodiment shown in FIG. 3 but this embodiment differs therefrom in that two pairs of engaging protrusions 35a and 35b (35b not seen) are provided on both sides of the insulating body 21 as indicated by broken lines in FIG. 3. The shield case 38 is also substantially identical in construction with that shown in the FIG. 4 embodiment except that the mounting leg 38F slightly differs in shape from the aforementioned leg 38F as will be described later on.

Figure 8A:
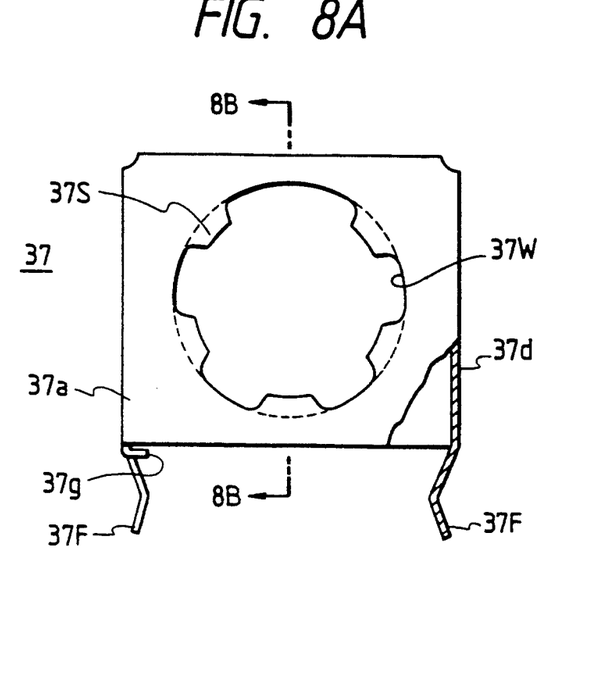
FIG. 8A is a front view of a metal cover 37 in FIG. 6.
Figure 8B:
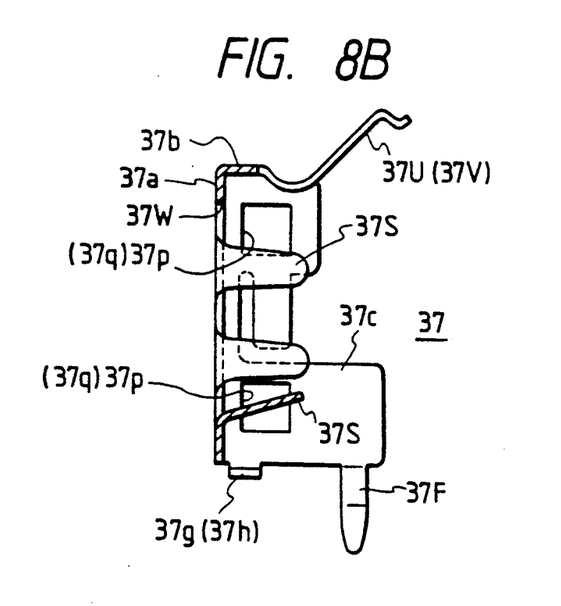
FIG. 8B is a sectional view taken on the line 8B—8B in FIG. 8A.

The connector of this embodiment has its front covered with a metal cover 37. The cover 37 is made of an elastic metallic material. FIGS. 8A and 8B are front and sectional views of the metal cover 37, respectively. The metal cover 37 includes a front panel 37a which abuts against the front of the insulating body 21, a top plate portion 37b which abuts against the top of the insulating body 21, left- and right-hand side holding portions 37c and 37d which abut against the left- and right-hand sides of the insulating body 21 to elastically grip it between them, and pressing tongue-like members 37F projecting out from lower marginal edges of the side holding portions 37c and 37d, respectively, as shown in FIGS. 8A and 8B. These portions of the metal cover 37 are punched out from a sheet of metal into one piece, which is bent into the metal cover 37. Accordingly, the cover 37 has no portions abutting against the bottom 21a of the insulating body 21 and the back of the terminal holding portion 24. The pressing tongue-like members 37F have their intermediate portions bent inwardly to come near each other so that the intermediate portions respectively have inwardly projected protrusions. When the connector 20 is mounted on the printed circuit board 13, the pressing tongue-like members 37F are inserted into the through holes 41 in the printed circuit board 13 and the inwardly projecting protrusions of the intermediate portions pass slightly over the lower edges of the through holes 41 so that the upper inclined portions of the intermediate portions resiliently abut or press against the lower edges of the through holes 41 as shown in FIG. 10B.

The front panel 37a has a circular window 37W through which the annular groove 22 cut in the front of the insulating body 21 and the front portion surrounded by the groove 22 are exposed to the outside. Further, the front panel 37a has a plurality of spring pieces 37S which extend rearwardly from the circumferential edge of the circular window 37W and are inserted into the annular groove 22 of the insulating body 21. The left- and right-hand side holding portions 37c and 37d have rectangular small windows 37p and 37q, respectively. When the cover 37 is put on the insulating body 21 from the front, the small windows 37p and 37q engage the small protrusions 35a and 35b formed on the both sides of the insulating body 21 (only the protrusion 35a being indicated by the broken line in FIG. 3), and locking portions 37g and 37h, which project out from the lower marginal edges of the left- and right-hand side holding portions 37c and 37d, are bent toward the bottom 21a of the insulating body 21. Thus, the cover 37 is secured to the insulating body 21.

Incidentally, the small projections 35a and 35b can be sloped backwardly so as to facilitate the mounting of the cover 37 onto the insulating body 21 from the front side thereof, but they may also be formed to a constant thickness. A pair of spring strips 37U and 37V are extended rearwardly from the rear edge of the top plate portion 37b of the cover 37 and, in FIG. 8B, their rear ends are shown to extend upwardly, but when the shield case 38 is put on the cover 37 as described later on, the rear ends of the spring strips 37U and 37V are pressed against the inner wall surface of the shield case 38 to electrically interconnect the cover 37 and the shield case 38.

Figure 9:
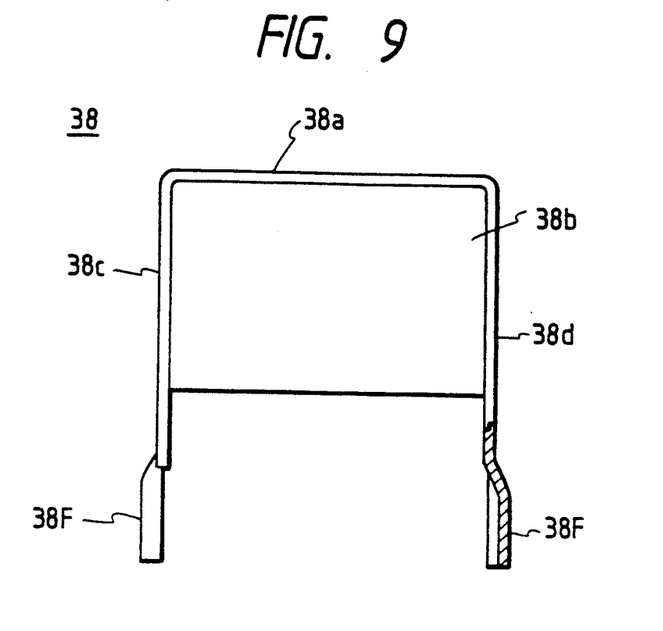
FIG. 9 is a front view of a shield case 38 in FIG. 6, showing its attachment leg in cross section.

As shown in FIG. 9, the shield case 38 includes a top panel 38a which abuts against the top of the insulating body 21 over the spring strips 37U, 37V of the cover 37, a rear panel 38b which abuts against the back of the insulating body 21, left- and right-side panels 38c and 38d which abut against the left and right sides of the insulating body 21 over the side holding portions 37c, 37d of the cover 37, respectively, and mounting legs 38F which extend downward from the lower marginal edges of the side panels 38c and 38d. These portions of the shield case 38 are punched out from a sheet of metal (a conductive material) in one piece, which is bent into the shield cover 38.

Figure 10A:
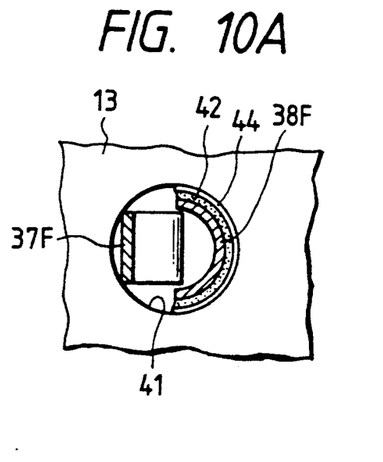
FIG. 10A is a sectional view taken on the line 10A—10A in FIG. 6.
Figure 10B:
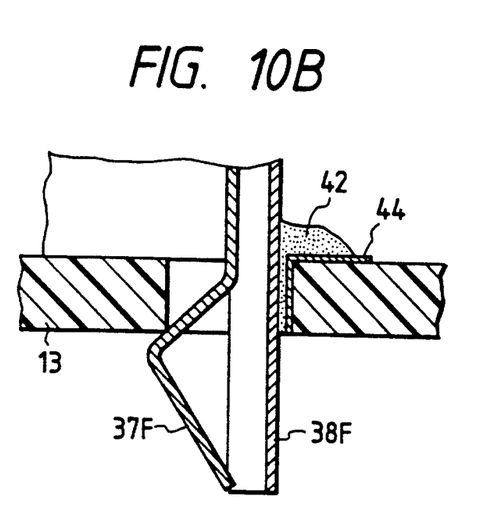
FIG. 10B is a sectional view taken on the line 10B—10B in FIG. 6.

As shown in FIGS. 10A and 10B which are sectional views taken on the lines 10A—10A and 10B—10B in FIG. 6, respectively, each mounting leg 38F is provided at a position opposite to the corresponding pressure tongue-like member 37F of the cover 37 and is shaped in a semi-cylindrical form so that its concave side faces the tongue-like member 37F. When the connector 20 covered with the cover 37 and the case 38 is mounted on the printed circuit board 13, each mounting leg 38F is inserted into a through hole 41 together with the pressing tongue-like member 37F and held in contact with the inner marginal edge of the through hole 41. In this case, since the intermediate portion of the pressing tongue-like member 37F is bent inwardly as mentioned above, the electrical part is clicked into engagement with the printed circuit board 13, that is, it is mounted on the printed circuit board 13 in a click stop manner, and once the electrical part is thus mounted on the printed circuit board 13, the pressing tongue-like member 37F abuts or presses elastically against the printed circuit board 13, thereby preventing the electrical part from not only floating on but also disengaging from the printed circuit board 13.

When other electrical parts are mounted on the printed circuit board 13, the electrical part according to the present invention is also disposed on the board 13 and then the board 13 is heated to reflow the soldering paste 42. On one or both sides of the printed circuit board 13 and on the inner peripheral surface of every through hole 41 there are deposited conductor lands 44 (for grounding connection) by means similar to circuit printing means, and before the board 13 is heated, when the soldering paste 42 is placed on the conductor lands 44. By this, the molten soldering paste 42 flows into the through hole 41 when the paste 42 is molten by reflow soldering. As a result, the mounting legs 38F are each mechanically fixed to the periphery of the lands 44 of the printed circuit board 13, and at the same time, the inner peripheral surface of the through hole 41 and the outer peripheral surface of the mounting leg 38F are fixed to each other by the soldering paste 42. Thus, the electrical part is firmly fixed to the printed circuit board 13.

As described above, according to the third aspect of the present invention, since the pressing tongue-like members of the cover are bent so that their intermediate portions protrude inwardly toward each other, the tongue-like members are inserted into the through holes and are engaged in a clip stop manner when the electrical part is mounted on the printed circuit board. In this state, the mounting legs of the shield case are held in close contact with the through holes and the inclined surfaces of the inwardly bent intermediate portions of the tongue-like members press against the lower marginal edges of the through holes, thus ensuring that the electrical part is prevented from floating from the printed circuit board and is firmly fixed to the printed circuit board.

Since the soldering paste having flowed into the through holes during reflow soldering mechanically couples the mounting legs, the pressing tongue-like members and the conductor lands around the through holes with one another, the mounting of the electrical part onto the printed circuit board can be further strengthened. Moreover, the soldering paste enters into gaps between the pressing tongue-like members and the mounting legs so that they are electrically connected with each other, and accordingly, a good shielding effect is obtained.

While the present invention has been described as being applied to connectors alone, the invention is also applicable to a switch and other electrical parts for surface mounting. It is also possible to omit the leg 31b extending rearwardly from each terminal 31 and instead use the lower marginal edge of the vertical portion 31a as the connection edge 32.

It will be apparent that many modifications and variations may be effected without departing from the scope of the novel concepts of the present invention.

What is claimed is:

1. An electrical part adapted to be surface mounted on a printed circuit board, said electrical part having a plurality of strip-like terminals projecting from an insulating body thereof, each of said strip-like terminals having a straight connection edge at a lower marginal edge of a projected end portion thereof oriented in a plane parallel to the bottom of said insulating body in the vicinity of said bottom, said electrical part having first and second metal mounting means for fixing said insulating body to a printed circuit board;

said first metal mounting means having a first pair of mounting legs projecting downwardly at both sides of the insulating body beyond the bottom of the body;

said second metal mounting means having a second pair of mounting legs projecting downwardly at both sides of the insulating body beyond the bottom of the body;

said first pair of mounting legs being tongue-like resilient metal legs which project downwardly beyond the bottom of the insulating body and have intermediate portions thereof bent inwardly toward each other;

said second pair of mounting legs being semi-cylindrical metal legs which project downwardly beyond the bottom of the insulating body to surround the outer surfaces of said tongue-like metal legs in opposed relation thereto;

one of said semi-cylindrical metal legs and one of said tongue-like metal legs being adapted to be pressed as a pair into the same through hole of a printed circuit board with the concave surface of the semi-cylindrical metal leg being opposed to and close to the outer surface of the tongue-like metal leg.

2. The electrical part of claim 1 wherein said first metal mounting means in a sheet metal cover having a front panel portion covering at least a portion of a front of said insulating body and side holding portions extending from sides of said front panel portion toward opposed sides of the insulating body to resiliently grip the body therebetween, said pair of tongue-like metal legs being projected from and formed integrally with lower margin edges of said side holding portions of said cover, respectively.

3. The electrical part of claim 1 wherein said second metal mounting means is a metal case having a top panel and a pair of side panels for covering at least a top and sides of said insulating body, said pair of semi-cylindrical metal legs being projected from and formed integrally with lower marginal edges of said side panels of said metal case, respectively.

4. The electrical part according to claim 1 wherein said electrical part is a connector;

said first mounting means being a metal cover having a front panel which abuts against a front of said insulating body, a top plate portion which abuts against a top of said insulating body, and left and right side holding portions which abut against left and right sides of said insulating body to resiliently grip said body therebetween, said left and right side holding portions having said tongue-like metal legs formed integrally therewith and projecting downward from lower marginal edges thereof beyond the bottom of said insulating body, respectively; and said second mounting means being a shield case having a top panel which covers the top of said insulating body, a rear panel which covers a back of said insulating body, and left and right side panels which cover the left and right sides of said insulating body, respectively, said left and right side panels having said semi-cylindrical metal legs formed integrally therewith and projecting downward from lower marginal edges thereof beyond the bottom of said insulating body, respectively.

5. The electrical part according to claim 1 wherein said first metal mounting means is a sheet metal cover having a front panel portion covering at least a portion of a front of said insulating body and side holding portions extending from sides of said front panel portion to sides of the insulating body to resiliently grip the body therebetween, said pair of tongue-like metal legs being projected from and integrally formed on lower marginal edges of said side holding portions of said cover, respectively, and said second metal mounting means being a metal case having a top panel and a pair of side panels for covering at least a top and opposite sides of said insulating body, said pair of semi-cylindrical metal legs being projected from and integrally formed on lower marginal edges of both said side panels of said metal case, respectively.

6. The electrical part according to claim 5 wherein said cover has plate-like spring means provided integrally therewith which extends from an upper marginal edge of the cover to the top of said insulating body, said spring means being bent to resiliently contact with the top panel of said metal case when said spring means is nipped between the top panel of said metal case and the top of said insulating body.

7. An electrical part adapted to be surface mounted on a printed circuit board, said electrical part having a plurality of strip-like terminals projecting from an insulating body thereof, each of said strip-like terminals having a straight connection edge at a lower marginal edge of a projected end portion thereof oriented in a plane parallel to the bottom of said insulating body in the vicinity of said bottom, said electrical part having metal mounting means for fixing said insulating body to a printed circuit board;

said metal mounting means comprising a pair of metal mounting legs projecting downwardly at both sides of said insulating body beyond the bottom of said body;

said pair of metal mounting legs each having an inverted truncated conical shape which tapers down, and said mounting legs having respective axes substantially parallel to the direction in which each of said mounting legs projects.

8. The electrical part according to claim 7 wherein said inverted truncated conical metal legs have hooks integral with intermediate portions of said legs.

9. The electrical part according to claim 7 wherein said electrical part is a connector;

said metal mounting means being a shield case having a top panel which covers a top of said insulating body, a rear panel which covers a back of said insulating body, and left and right side panels which cover left and right sides of said insulating body, respectively;

said left and right side panels having said inverted truncated conical metal legs formed integrally therewith and projecting downward from lower marginal edges thereof beyond the bottom of said insulating body, respectively.

10. The electrical part of claim 7 wherein said metal mounting means is a metal case having at least a top panel which covers a top of said insulating body and left and right side panels which cover left and right sides of said insulating body, respectively;

said left and right side panels having said inverted truncated conical metal legs formed integrally therewith and projecting downward from lower marginal edges thereof, respectively.

11. The electrical part according to claim 10 wherein said inverted truncated conical metal legs have hooks integral with intermediate portions of said legs.

* * * * *